United States Patent [19]

Cammarano et al.

[11] 4,272,722
[45] Jun. 9, 1981

[54] DETERMINATION OF ELECTRIC CURRENT FLOW PATTERNS

[75] Inventors: Armando S. Cammarano, Hyde Park; Giulio DiGiacomo, Poughkeepsie; Stephen S. Drofitz, Jr., Wappingers Falls, all of N.Y.

[73] Assignee: International Business Machines Corporation, Armonk, N.Y.

[21] Appl. No.: 26,491

[22] Filed: Apr. 3, 1979

[51] Int. Cl.³ .................................. G01R 19/00
[52] U.S. Cl. ......................... 324/76 R; 324/71 R
[58] Field of Search ............... 324/71 R, 76 R, 117 R, 324/158 R

[56] References Cited

U.S. PATENT DOCUMENTS 2,673,325  3/1954  Orr ..................................... 324/71 R

Primary Examiner—Michael J. Tokar
Attorney, Agent, or Firm—Edward S. Gershuny

[57] ABSTRACT

A method for determining the paths of current flow in an irregularly shaped conductor. A metal is plated onto a substrate in the desired geometric pattern. The metal is then brought to within about 4 percent of its melting point and a current is put through it. After an amount of time that depends upon the temperature and current utilized, there will have been a mass migration in the metal resulting in a corrugated surface having ridges and valleys that are parallel to the current flow. The ridges and valleys may be observed optically or by scanning electron microscope.

7 Claims, 7 Drawing Figures

500 X

200 X

DETERMINATION OF ELECTRIC CURRENT FLOW PATTERNS

INTRODUCTION

This invention relates to mapping lines of current flow in a conductor. More particularly, the invention utilizes the phenomenon of electromigration to produce a visually observable map of current flow in an irregularly shaped conductor.

Prior art techniques for determining the lines of current flow in an irregularly shaped conductor have typically relied upon simulation, through the use of mathematical models, of the manner in which current flows through the conductor. These techniques are extremely complex and time consuming and their accuracy is somewhat questionable.

There are several reasons why it is desirable to know how current flows through an irregularly shaped conductor. Such knowledge can be used, for example, in optimizing conductor geometries so as to effectively utilize gold and other precious elements that are used in their manufacture.

SUMMARY OF THE INVENTION

In accordance with one preferred embodiment of this invention, a metal plating consisting of 50 percent lead and 50 percent indium is placed on a substrate. An electric current ranging from about 2000 amperes per square centimeter to about 10,000 amperes per square centimeter is run through the plating for about 500 hours at about 175° C. After this time, the metal plating exhibits a mass rearrangement normal to the current flow, forming a pattern of corrugated lines parallel to the current flow.

In accordance with other aspects of the invention, other metal platings are used. Temperature should be equal to or higher than approximately 96 percent of the absolute (Kelvin) melting point of the metal. The metal plating should be a single phase metal at the temperature at which this method is performed. The amount of time required for producing the corrugated current flow pattern will decrease as the temperature nears the melting point of the metal and/or as the current is increased.

DETAILED DESCRIPTION

When a metal plating of fifty percent lead and fifty percent indium is placed on a substrate, and an electric current is run through it, the metal exhibits a mass rearrangement normal to the electron flow such that a pattern of corrugated lines is formed parallel to the current flow. This was observed to have taken place at 175° C. at a current flow of 10,000 amps per square centimeter for 100 hours. The height of the ridges is three to four times the thickness of the original film. At the valleys, the film is, on the average, about one twentieth the thickness of the original.

In the experiments described herein, all percentages are given by weight. The test films were evaporated on glass slide substrates after films comprising 500 Angstroms chromium and 500 Angstroms copper were deposited. The Cu/Cr films formed a base to which the test film would readily adhere. The evaporations and depositions were performed according to standard processes and need not be described herein. The films were analyzed optically and by scanning electron microscope (SEM) to observe the state of the film surface before stressing began.

If a base film is used between the test film and the substrate, it should preferably be selected so as to have a higher melting point than the test film and to have a higher resistance than the test film. The higher melting point is necessary so the base film will not affect the experimental results by diffusing into the test film or by forming ridges and valleys itself. The higher resistance is necessary so the base film will not "short circuit" the test film by presenting an easier path for current flow.

Current densities of 4500, 6700, 10,000 and 20,000 amperes per square centimeter at 125° C., 150° C. and 175° C. were applied to films of 95 percent lead-5 percent tin for 300 hours. The films were then again observed by SEM and by light microscopy to determine the effects of electromigration stresses. The experiments were conducted in ovens in which a nitrogen atmosphere was maintained during testing.

The analysis performed on 95 percent lead-5 percent tin showed regions of total depletion along the film and regions of hillock deposits. The hillocks ranged in size from a few microns to about 100 microns and extended all the way through the thickness of the film (about 2.5 microns). The depletions appear to be characteristic of two-phase solder systems such as lead-tin where the tin-rich phase serves as a nucleating site.

Figure 1:
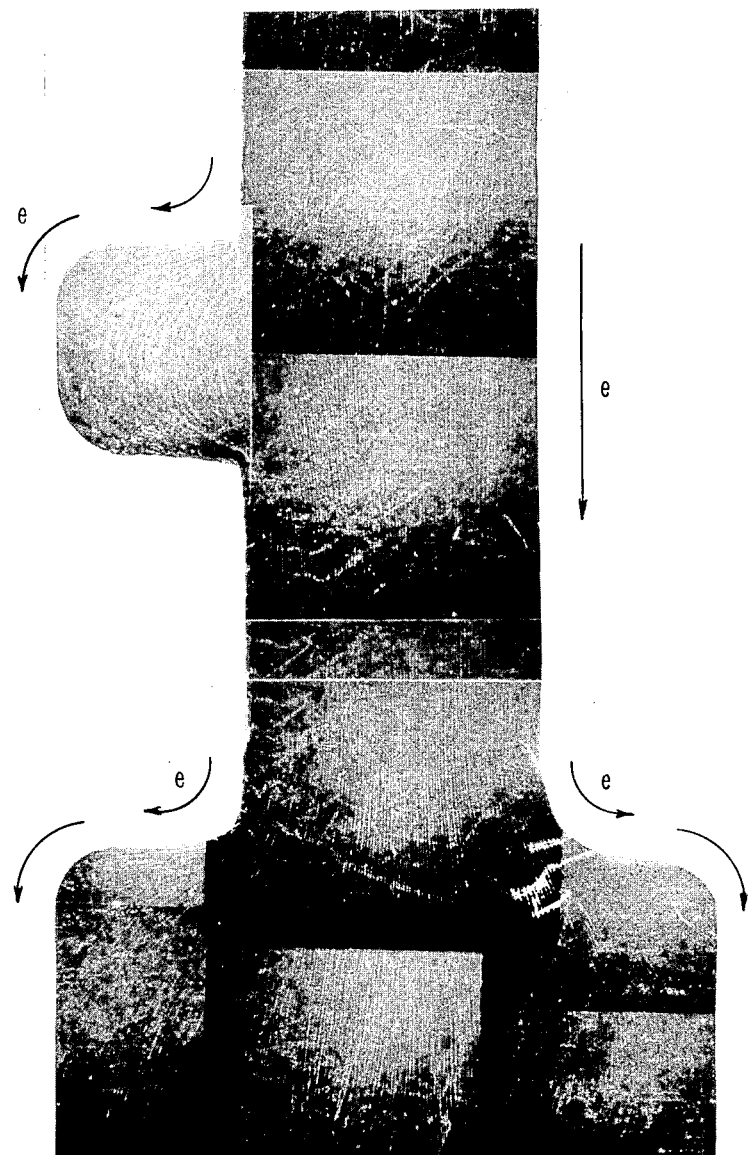
FIG. 1 is a composite photograph of views through a microscope of an irregularly shaped conductor showing current flow paths. The views were taken at about 6X.
Figure 2:
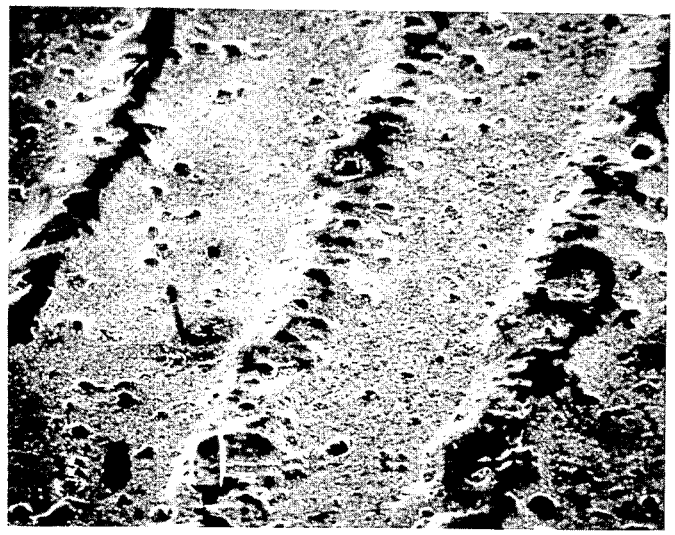
FIG. 2 is a view at 500X showing further details of the ridges and valleys.
Figure 3:
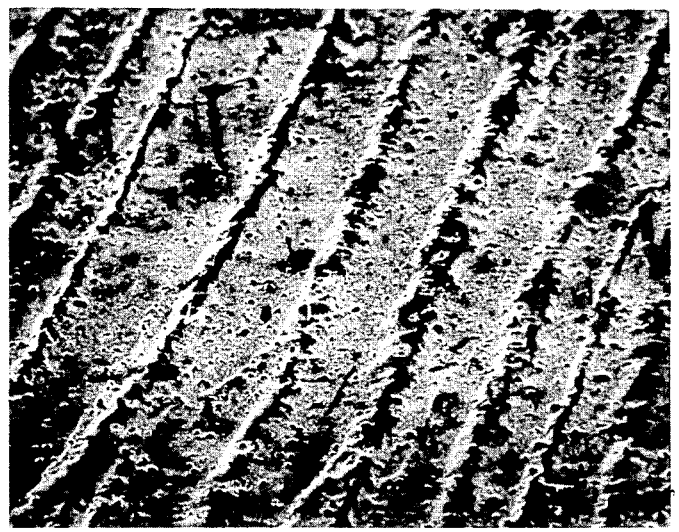
FIG. 3 is a view similar to the one shown in FIG. 2, but taken at 200X.

A 50 percent lead-50 percent indium film stressed at 175° C. and 10,000 amperes per square centimeter for 100 hours revealed an electromigration mechanism quite different from that observed for 95 percent lead-5 percent tin. Although mass transport apparently due to electromigration did occur, it apparently occurred along depletion lines parallel to the current flow. Neither total depletions nor hillocks were observed, except at the contact edges of the film. Instead, a corrugated pattern of solid lines, consisting of ridges and valleys, developed as a result of the stressing. One of the observed patterns is shown in FIG. 1. There are about 150 lines per centimeter. The lines follow the shape of the film closely. Moving from the narrow section into the wider section, the extreme lines bend 90° from their original direction to conform with the film geometry, indicating an abrupt decrease in current density. (The shading visible in FIG. 1 results from the fact that this figure is a composite photograph, made from several smaller photographs each of which was darker on its right side than on its left side. The metal film was observed to be substantially constant in shading except for the ridges and valleys due to current flow.) Enlarged details of the solder lines are shown in FIG. 2 (500 power magnification) and FIG. 3 (200 power magnification). As these figures show, the lines resemble a corrugated sheet. Protrusions shown in FIGS. 2 and 3 have been identified as copper-indium intermetallics scattered, apparently at random, over the film.

Figure 4:
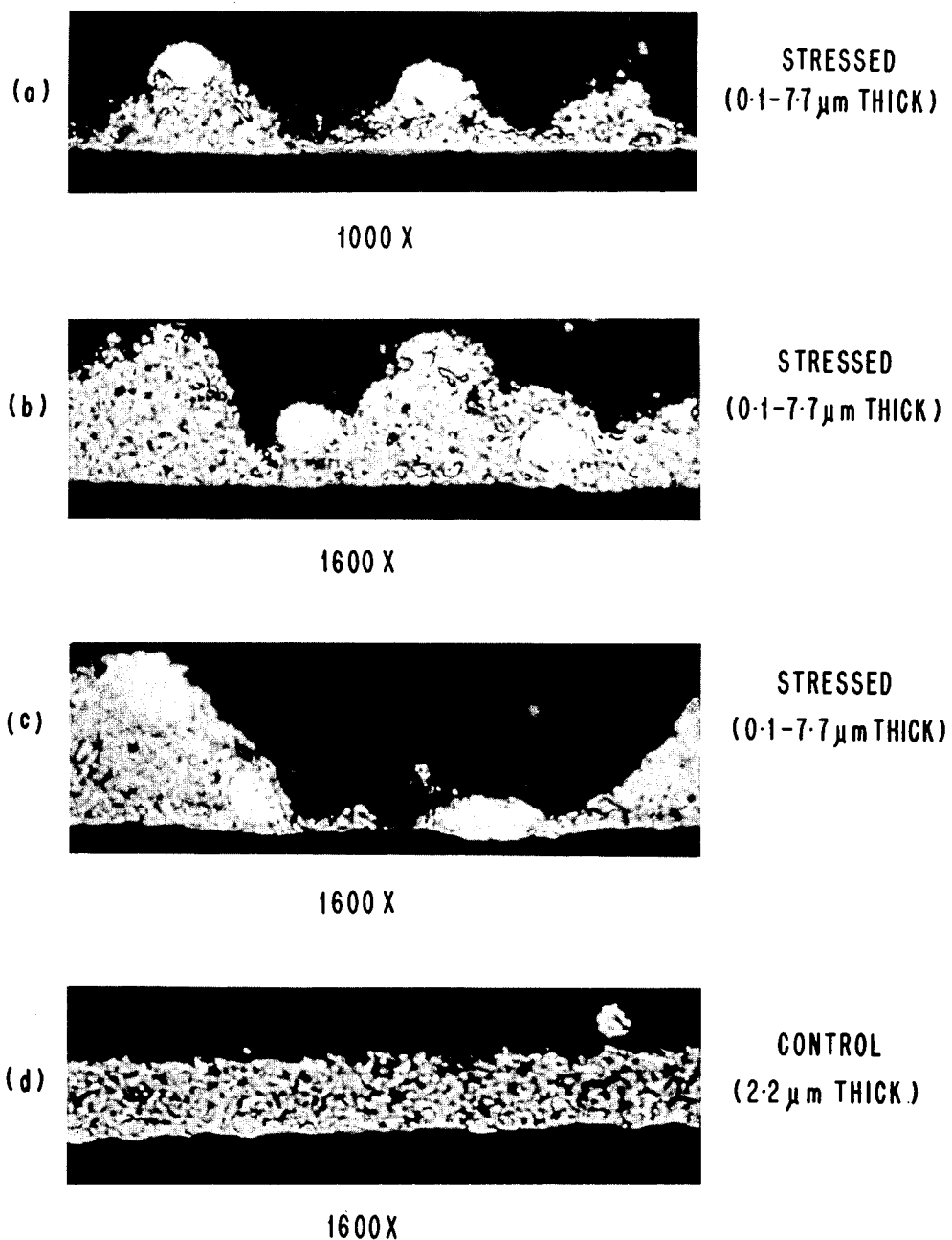
FIG. 4 shows microphotographs of cross-sections of the film before stressing (4d) and after stressing (4a, 4b, 4c).

Additional details of the film may be seen in the cross-sections shown in FIG. 4. FIG. 4d shows a 1600X magnification of the unstressed 50 percent lead-50 percent indium film. It is of a relatively uniform thickness of approximately 2.2 microns. After stressing as described above, the film ranges in thickness from about 0.1 to about 7.7 microns. FIG. 4a is a 1000X photograph in which three ridges are clearly seen. FIGS. 4b and 4c are photographs at 1600X showing more details of ridges and valleys. In FIG. 4b the protrusions are copper-indium intermetallics.

Non-dispersive X-ray analysis revealed no significant difference in composition between the ridges and valleys of the film after stressing. A somewhat greater indium intensity, relative to lead, was recorded at the extremely thin regions where the residual film was completely penetrated by the electron beam and silicon was detected from the substrate. However, due to difficulties in the interpretation of the relative intensities for infinite and finite thicknesses, we can not conclude that more indium is present in the valleys. FIG. 4 shows sections of the film before and after electromigration stress. It can be clearly seen that the lead-indium mass, after stressing, redistributed itself normal to the direction of the current flow to form ridges about three to four times thicker than the original film and valleys that are about one twentieth the thickness of the original film.

Ninety percent lead-10 percent indium, 93 percent lead-2 percent tin-5 percent indium and 98 percent lead-2 percent tin alloys were stressed at 200° C. and 10,000 amperes per square centimeter for about 300 hours. These alloys, which are one-phase systems at use conditions, did not exhibit the electromigration phenomena discussed above. However, the temperature was well below the melting point of the alloy. Also the indium diffusivity in 90 percent lead-10 percent indium alloy is more than three orders of magnitude less than the indium diffusivity in 50 percent lead-50 percent indium alloy.

DETERMINATION OF PARAMETERS

As the temperature, or the current, or both are increased, the time it takes to create the pattern of ridges and valleys decreases.

The height of the ridges, and depth of the valleys, depend upon the amount of mass that is transported due to electromigration phenomena.

$$Q = \dot{Q}T \text{ mole/cm}^2$$

where Q is the total mass transported, $\dot{Q}$ is the mass transport rate and t is the elapsed time.

The mass transport rate $$\dot{Q} = (eZ^*CD\rho J)/kT \text{ mole/s·cm}^2$$

where
- $eZ^*$ = effective charge, coulomb/mole
- C = concentration (solute concentration when the metal is an alloy), mole/cm$^3$
- D = diffusivity (solute diffusivity when the metal is an alloy), cm$^2$/s
- $\rho$ = resistivity, $\Omega$cm
- J = current density, Ampere/cm$^2$
- k = Boltzmann's constant = 8.3 Joule/mole·°K
- T = absolute temperature, °K
- $T_m$ = melting point, °K.

The diffusivity:

$$D = D_o e^{-\beta T_m/RT}$$

where
- R = heat absorption, cal/mole·°K.

and
- $D_o$ and $\beta$ are constants which depend upon the element or alloy being used.

For an alloy of 50 percent lead-50 percent indium, the mass transport rate can be calculated from the following
- $eZ^* = 7 \times 10^5$ coulomb/mole
- C = 0.04 mole/cm$^3$
- $\rho = 2 \times 10^{-5} \Omega$cm
- J = 10$^4$ A/cm$^2$
- $T_m = 458°$ K. (185° C.)
- R = 2 cal/mole·°K.
- $D_o = 0.18$ cm$^2$/s
- $\beta = 32.5$K cal/mole.

If we select $T = 0.96 T_m = 440°$ K., then $$D = 3.02 \times 10^{-8} \text{cm}^2/\text{s}$$

and the mass transport rate $$\dot{Q} = 4.6 \times 10^{-8} \text{ mole/s·cm}^2 \text{ at } 440° \text{ K. } (167° \text{ C.}).$$

With the parameters given above, stressing the film for about 100 hours was found to result in a very well defined pattern of ridges and valleys. When the current was reduced by a factor of five, to $2 \times 10^3$ A/cm$^2$, the stressing time needed to be increased by a factor of five, to 500 hours, to compensate for the reduced mass transport rate.

Values for parameters used above were obtained from Campbell et al, Acta Metallurgica, Volume 24 (1976). For other single phase alloys and elements, the values of D, $eZ^*$, $\rho$, C, $T_m$, $\beta$ and $D_o$ are available from the same reference and from other commonly available publications such as, for example, Thin Solid Films, Metal Transactions and Journal of Applied Physics. In addition, melting points for various alloys are obtainable from phase diagrams in Hansen, Constitution of Binary Alloys, published by McGraw Hill, 1958.

As may be observed from an inspection of the irregular shape shown in FIG. 1, the separation between the ridges increases as they curve into wider sections of the film or into film extensions normal to the direction of the applied current. Since the line density varies with the film width and geometry, the pattern enables one to determine the current density, electrostatic equipotentials, and electromigration propensity at any point, no matter how complex the conductor geometry.

While the invention has been described with reference to a preferred embodiment thereof, it will be understood by those skilled in the art that the above and other changes may be made therein without departing from the spirit and scope of the invention.

Having thus described our invention, what we claim as new, and desire to secure by Letters Patent is:

1. A method of producing a visually observable mapping of the flow of electric current through a metal conductor comprising the steps of:

heating said conductor to a temperature equal to or greater than approximately 96 percent of its melting temperature;

applying an electric current to said conductor; and maintaining the heat and the electric current for a sufficient amount of time to develop a pattern of ridges and valleys parallel to the direction of current flow in the conductor.

2. A method for producing a visually observable indication of the flow of current through a metal conductor comprising the steps of:

depositing on a glass substrate a first film having a melting temperature higher than the melting temperature of said metal conductor, and having a resistance higher than the resistance of said metal conductor;

depositing on said first film the metal conductor that is to be investigated;

heating said conductor to a temperature equal to or greater than approximately 96 percent of its melting temperature;

applying an electric current to said conductor; and maintaining the heat and the electric current for a sufficient amount of time to develop a pattern of ridges and valleys parallel to the direction of current flow in the conductor.

3. The method of claim 2 wherein said first film consists of approximately 500 Ångstroms of copper deposited over approximately 500 Ångstroms of chromium.

4. The method of claim 1 or 2 wherein said metal conductor exhibits a single phase at the temperature utilized in this process.

5. The method of claim 4 wherein said metal conductor consists substantially of 50 percent lead and 50 percent indium.

6. The method of claim 4 wherein said electric current is between approximately $2 \times 10^3$ A/cm$^2$ and $10^4$ A/cm$^2$, and said heat and electric current are maintained for between approximately 500 hours and 100 hours.

7. The method of claim 1 wherein the metal conductor, temperature and electric current are selected such that the mass transport rate of the conductor will be equal to or greater than approximately $9.2 \times 10^{-9}$ mole/s·cm$^2$.

* * * * *